United States Patent
Shirakawa et al.

(10) Patent No.: US 8,633,783 B2
(45) Date of Patent: Jan. 21, 2014

(54) ELECTROMAGNETIC COUPLER AND COMMUNICATION APPARATUS USING THE SAME

(75) Inventors: Yohei Shirakawa, Hitachi (JP); Keisuke Fukuchi, Hitachi (JP); Haruyuki Watanabe, Hitachi (JP)

(73) Assignees: Hitachi Cable Fine-Tech, Ltd., Hitachi-shi, Ibaraki (JP); Hitachi Cable, Ltd., Tokyo (JP)

( * ) Notice: Subject to any disclaimer, the term of this patent is extended or adjusted under 35 U.S.C. 154(b) by 413 days.

(21) Appl. No.: 12/923,817

(22) Filed: Oct. 8, 2010

(65) Prior Publication Data
US 2011/0109408 A1    May 12, 2011

(30) Foreign Application Priority Data
Nov. 6, 2009  (JP) .................................. 2009-255026

(51) Int. Cl.
*H01P 5/02*    (2006.01)
*H01G 2/22*    (2006.01)
(52) U.S. Cl.
USPC ..................... 333/24 C; 333/24 R; 361/271
(58) Field of Classification Search
USPC ................... 333/24 R, 24 C, 140; 361/271
See application file for complete search history.

(56) References Cited

U.S. PATENT DOCUMENTS

| | | | |
|---|---|---|---|
| 7,518,465 B2 * | 4/2009 | Savic et al. | 333/24 R |
| 7,541,979 B2 | 6/2009 | Takei et al. | |
| 2006/0097932 A1 | 5/2006 | Takei et al. | |
| 2008/0076351 A1 | 3/2008 | Washiro | |

FOREIGN PATENT DOCUMENTS

| | | |
|---|---|---|
| JP | 07-336133 A | 12/1995 |
| JP | 2003-258533 A | 9/2003 |
| JP | 2006-005645 A | 1/2006 |
| JP | 2006-121315 A | 5/2006 |
| JP | 2007-228353 A | 9/2007 |
| JP | 2007-267041 A | 10/2007 |
| JP | 2008-99236 A | 4/2008 |
| JP | 4304642 B1 | 5/2009 |
| JP | 4345851 B2 | 7/2009 |
| JP | 2010-096620 A | 4/2010 |

OTHER PUBLICATIONS

Japanese Office Action dated Mar. 19, 2013 with an English translation.

* cited by examiner

*Primary Examiner* — Benny Lee
*Assistant Examiner* — Rakesh Patel
(74) *Attorney, Agent, or Firm* — McGinn IP Law Group, PLLC

(57) ABSTRACT

An electromagnetic coupler has a first conductor pattern and a second conductor pattern separated from the first conductor pattern that are formed in a first plane, a feeding pattern made of a conductor and being connected to a feeing system and a ground made of a conductor and being separated from the feeding pattern that are formed in a second plane, and linear conductors electrically connecting between the first conductor pattern and the feeding pattern, and between the second conductor pattern and the ground, respectively.

20 Claims, 13 Drawing Sheets

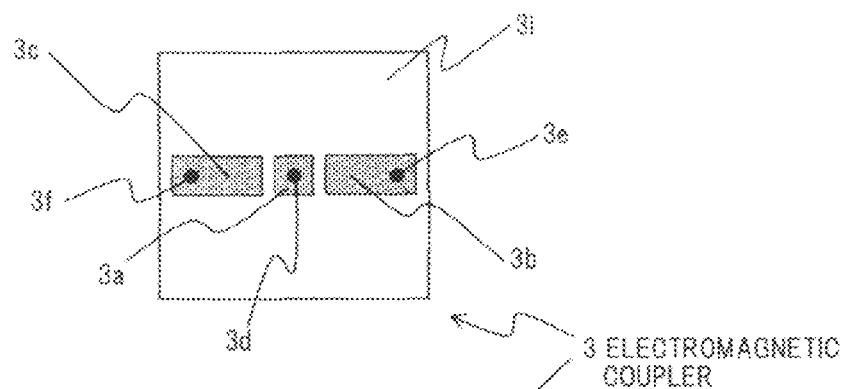
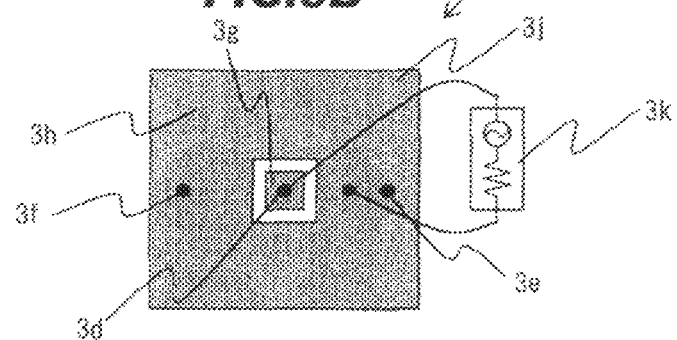
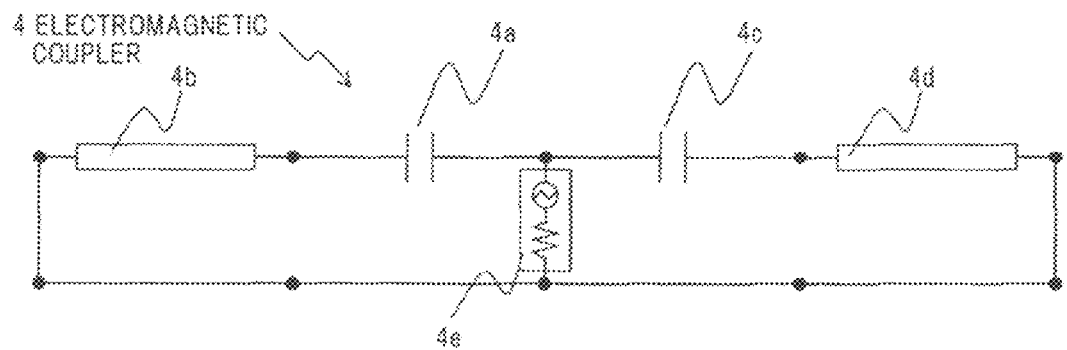

5 ELECTROMAGNETIC COUPLER

13 ELECTROMAGNETIC COUPLER

14 ELECTROMAGNETIC COUPLER

16 ELECTROMAGNETIC COUPLER

17 ELECTROMAGNETIC COUPLER

ELECTROMAGNETIC COUPLER AND COMMUNICATION APPARATUS USING THE SAME

The present application is based on Japanese Patent Application No. 2009-255026 filed on Nov. 6, 2009, the entire contents of which are incorporated herein by reference.

BACKGROUND OF THE INVENTION

1. Field of the Invention

The present invention relates to an electromagnetic coupler and a communication apparatus using the same that is suitable for a radio communication system for transmitting data using electrostatic field or induced electric field between communication devices located with a short distance.

2. Prior Art

As to conventional electromagnetic couplers, Japanese Patent No. 4345851 discloses one example of the conventional electromagnetic couplers. The electromagnetic coupler (radio frequency coupler) disclosed by Japanese Patent No. 4345851 is configured by connecting electrodes, a series inductor, and a parallel inductor provided on a flat plate via a radio frequency signal transmission line. In addition, the electromagnetic coupler is installed in a communication device such as transmitter or receiver. When the transmitter and the receiver are disposed such that respective electrodes of electromagnetic couplers in the transmitter and the receiver are facing to each other, in the case where a distance between the two electrodes is equal to or less than $2\lambda/15$ of a wavelength $\lambda$ of a used frequency, the two electrodes are coupled to each other by an electrostatic field component of a longitudinal wave, so that the two electrodes functions as one capacitor. As a result, such an arrangement totally functions as a band pass filter, so that it is possible to transmit the data with high efficiency between the two electromagnetic couplers. In the case where the distance between the two electrodes is $2\lambda/15$ to $8\lambda/15$ of the wavelength $\lambda$ of the used frequency, it is possible to transmit the data by using an induced electric field of the longitudinal wave.

On the other hand, when the distance between the two electrodes of the two electromagnetic couplers is a long distance which is greater than a predetermined value, the data transmission is impossible.

Accordingly, the electromagnetic coupler disclosed by Japanese Patent No. 4345851 is characterized in that other radio communication systems are not disturbed by an electromagnetic wave generated by the electromagnetic coupler, and the radio communication system using the communication device having the electromagnetic coupler is not interfered with the other radio communication systems. Based on these features, according to the radio communication system using the conventional electromagnetic coupler, it is possible to carry out the data transmission of large capacitance between the communication devices by UWB (Ultra Wide Band) communication method using wide band signal, with the use of the electrostatic field or induced electric field of the longitudinal wave over a short distance.

As described above, there is a problem in that the efficiency of the signal transmission is deteriorated when the electromagnetic coupler at one side does not match well with the electromagnetic coupler at an opposite side, although the data can be transmitted with high efficiency by realizing the band pass filter in the case where the distance between the electrodes of the two electromagnetic couplers is equal to or less than $2\lambda/15$ of the wavelength $\lambda$ of the used frequency. In other words, in the conventional electromagnetic coupler, the electrodes of the two electromagnetic couplers are coupled to each other by the electrostatic field component of the longitudinal wave, so that the two electrodes function as one capacitor. As a result, the band pass filter is realized by the series inductor and the parallel inductor connected to the two electrodes. However, for example, when this electromagnetic coupler is installed within the equipment and the radio communication is carried out, there is a cover of the equipment or the like including dielectric material between the electromagnetic couplers, so that a dielectric constant between the electromagnetic couplers varies due to the dielectric material. Therefore, a capacitance value of the capacitor provided between the electrodes of the two electromagnetic couplers varies, so that frequency characteristics of the band pass filter vary. In some cases, the data transmission characteristics in a desired frequency band may be deteriorated. For this case, even if the electromagnetic coupler is designed based on presumption that the dielectric constant varies, when the equipment carrying out the radio communication is different from the equipment including the designed electromagnetic coupler, the value of the dielectric constant between the electromagnetic couplers will be different from the designed value. Therefore, similar to the former example, the data transmission characteristics of the radio communication will be deteriorated.

In addition, when the distance between the electrodes of the two electromagnetic couplers is $2\lambda/15$ to $8\lambda/15$ of the wavelength $\lambda$ of the used frequency, the data transmission is carried out by using the induced electric field component of the longitudinal wave. At this time, when location and surrounding environment of the two electromagnetic couplers are kept constant, the data transmission characteristics depend upon matching condition between the electromagnetic couplers and a feeding system. In other words, when the matching condition is good, intensity of signals transmitted from the electromagnetic coupler to a communication module including the feeding system increases. On the contrary, when the matching condition is bad, the intensity of the signals transmitted from the electromagnetic coupler to the communication module including the feeding system decreases. In the conventional devices, the electromagnetic coupler is designed in such a manner that the band pass filter is realized when the distance between the electromagnetic couplers is equal to or less than $2\lambda/15$ of the wavelength $\lambda$ of the used frequency. However, it is further necessary to consider the matching condition for the case where the distance between the electromagnetic couplers is $2\lambda/15$ to $8\lambda/15$ of the wavelength $\lambda$ of the used frequency. Therefore, when the signal intensity is insufficient in the case where the distance between the electromagnetic couplers is $2\lambda/15$ to $8\lambda/15$, for example, it is necessary to re-design the device including a configuration for realizing the band pass filter in the case where the distance between the electromagnetic couplers is equal to or less than $2\lambda/15$ of the wavelength $\lambda$ of the used frequency, so that great care is required for designing the electromagnetic coupler. Further, when the used frequency band is a wide band, it is necessary to realize electromagnetic coupler adapted for a large number of frequencies for which the matching condition is suitable, so that troublesome work is required in designing.

SUMMARY OF THE INVENTION

Accordingly, an object of the present invention is to provide an electromagnetic coupler, by which data transmission characteristics similar to the conventional device are maintained, and which hardly depends on variation in the dielectric constant between the electromagnetic couplers.

Another object of the present invention is to provide an electromagnetic coupler, by which the data transmission characteristics similar to the conventional device are maintained, and it is possible to carry out matching adjustment with the feeding system and adjustment of frequency band easily.

According to a feature of the invention, an electromagnetic coupler comprises:

a first conductor pattern and a second conductor pattern separated from the first conductor pattern, the first conductor pattern and the second conductor pattern being formed in a first plane;

a feeding pattern comprising a conductor and being connected to a feeding system and a ground comprising a conductor and being separated from the feeding pattern, the feeding pattern and the ground being formed in a second plane; and linear conductors electrically connecting between the first conductor pattern and the feeding pattern, and between the second conductor pattern and the ground, respectively.

The linear conductors may be vertical to the second plane.

A printed board may be formed between the first plane and the second plane, and the linear conductors are formed inside of through-holes formed in the printed board.

The second conductor pattern may be point-symmetrical with respect to a connecting point between the first conductor pattern and one of the linear conductors.

The linear conductors may be point-symmetrical with respect to a connecting point between the first conductor pattern and one of the linear conductors.

The second conductor pattern comprises conductor patterns and each of the conductor patterns may be connected to the ground via each of the linear conductors.

Each of the first conductor pattern and the second conductor pattern may have a rectangular shape.

The second conductor pattern may comprise four rectangular conductor patterns, and the four rectangular conductor patterns may be radially disposed to face to sides of an outer periphery of the first conductor pattern, respectively.

A total number of the linear conductors formed between the second conductor pattern and the ground may be four, and the four linear conductors may be disposed with an interval of an angle of 90° with respect to a connecting point between the first conductor pattern and one of the linear conductors as a center.

The first conductor pattern may have a rectangular shape, and the second conductor pattern may comprise two L-shaped conductor patterns surrounding the first conductor pattern.

The first conductor pattern may have a cross-like shape, and the second conductor pattern may comprise four conductor patterns, each of which may have a side facing to at least one side of an outer periphery of the first conductor pattern.

The second conductor pattern may surround the first conductor pattern.

The first conductor pattern may have a circular shape and the second conductor pattern may have an annular shape.

The first conductor pattern may have a rectangular shape and the second conductor pattern may have a rectangular shape having an inner periphery facing to an outer periphery of the first conductor pattern.

The first conductor pattern may have a star-like shape having a plurality of protrusions and the second conductor pattern may have a star-like shape having an inner periphery facing to an outer periphery of the first conductor pattern.

The linear conductors may be formed between the second conductor pattern and the ground.

The linear conductors may be equiangular with respect to a connecting point between the first conductor pattern and one of the linear conductors as a center.

The second conductor pattern may be divided into plural sections in a circumferential direction.

The ground may surround the feeding pattern.

According to another feature of the invention, a communication apparatus comprises:

an electromagnetic coupler comprising:

a first conductor pattern and a second conductor pattern separated from the first conductor pattern, the first conductor pattern and the second conductor pattern being formed in a first plane;

a feeding pattern comprising a conductor and being connected to a feeing system and a ground comprising a conductor and being separated from the feeding pattern, the feeding pattern and the ground being formed in a second plane; and linear conductors electrically connected between the first conductor pattern and the feeding pattern, and between the second conductor pattern and the ground, respectively, in which data is transmitted by using an electrostatic field or an induced electric field.

ADVANTAGES OF THE INVENTION

According to the present invention, it is possible to provide an electromagnetic coupler, by which data transmission characteristics similar to the conventional device are maintained, and which hardly depends on variation in the dielectric constant between the electromagnetic couplers.

Further, according to the present invention, it is possible to provide an electromagnetic coupler, by which the data transmission characteristics similar to the conventional device are maintained, and it is possible to carry out matching adjustment with the feeding system and adjustment of frequency band easily.

BRIEF DESCRIPTION OF DRAWINGS

Next, preferred embodiment according to the invention will be explained in conjunction with appended drawings, wherein:

FIGS. 3A and 3B are explanatory diagrams showing an electromagnetic coupler in a second embodiment according to the present invention;

FIG. 4 is a circuitry diagram showing a second model of an electromagnetic coupler of the present invention;

FIG. 10 is an explanatory diagram showing a method of the experiment shown in

FIG. 7;

DETAILED DESCRIPTION OF THE PREFERRED EMBODIMENTS

Next, the preferred embodiments according to the present invention will be explained in more detail in conjunction with the appended drawings.

(First Model of the Electromagnetic Coupler)

Figure 1:
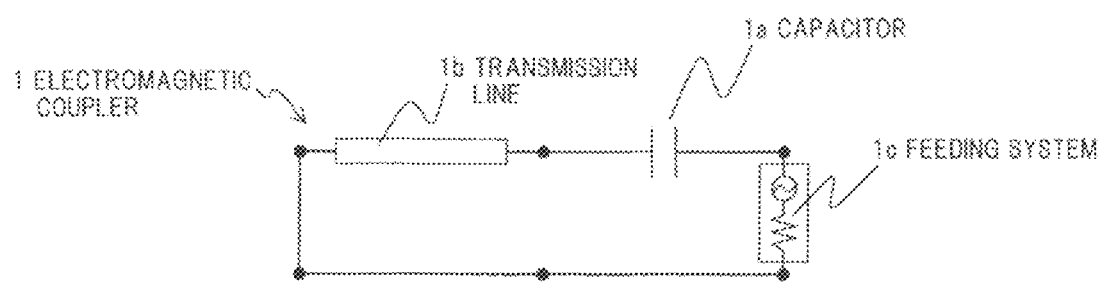
FIG. 1 is a circuitry diagram showing a first model of an electromagnetic coupler of the present invention.

In the present invention, at least one of the aforementioned problems is solved by using an electromagnetic coupler 1 in the first model shown in FIG. 1.

Referring to FIG. 1, the electromagnetic coupler 1 comprises a capacitor 1a and a transmission line 1b.

Japanese Patent Laid-Open No. 2006-121315 (JP-A 2006-121315) discloses a technique for calculating characteristics impedances.

Input impedance $Z_{in}$ of the electromagnetic coupler 1 shown in FIG. 1 can be calculated based on disclosure of Japanese Patent Laid-Open No. 2006-121315. The input impedance $Z_{in}$ of the electromagnetic coupler 1 can be approximated according to formula $$Z_{in} = \frac{Z_o l \alpha \omega}{v} + j\left(\frac{Z_o l \omega}{v} - \frac{1}{\omega C}\right) \quad (1)$$

wherein characteristics impedance of the transmission line is $Z_o$, loss coefficient of the transmission line is $\alpha$, electrical length of the transmission line is l, capacitance is C, velocity of electromagnetic wave is v, and angle frequency is $\omega$, under condition that $\omega \cdot l/v \ll 1$ is established.

For enhancement of matching property with the feeding system, it is necessary to provide the input impedance of the electromagnetic coupler as a complex conjugate of an impedance of the feeding system. As understood from the formula (1), the input impedance $Z_{in}$ of the structure shown in FIG. 1 is a complex composed of real number component and imaginary component. Herein, the loss coefficient α exists only in the real number component and the capacitance C only exists in the imaginary component. Therefore, according to this structure, it is possible to control the real number component and the imaginary component independently from each other, so that the matching adjustment with the feeding system is easy.

In addition, the matching condition can be generally expressed as formula (2) by using the reflection coefficient Γ:

$$\Gamma = \frac{Z_{in} - Z_F}{Z_{in} + Z_F} = 1 - \frac{2 Z_F}{Z_{in} + Z_F} \quad (2)$$

wherein the impedance of the feeding system is $Z_F$.

As understood from the formula (2), the number of frequencies for which the matching condition is suitable, i.e. the frequency band, depends on the frequency characteristics of the reflection coefficient. Further, the frequency band generally depends on the frequency characteristics of the input impedance $Z_{in}$, of the electromagnetic coupler, since the impedance $Z_F$ of the feeding system is generally constant. In addition, the frequency band depends on a rate of variation of the reflection coefficient Γ with respect to the frequency. For example, it is suitable for realizing a narrow band when the rate of variation of the reflection coefficient Γ to the frequency is small, and it is suitable for realizing a wide band when the rate of variation of the reflection coefficient Γ to the frequency is large. This relationship can be also established between the input impedance $Z_{in}$ and the frequency of the electromagnetic coupler.

Based on the formula (1), the rate of variation of the input impedance $Z_{in}$ of the electromagnetic coupler according to the present invention to the frequency (angle frequency ω) is shown as formula (3):

$$\frac{\partial Z_{in}}{\partial \omega} = \frac{Z_o l \alpha}{v} + j\left(\frac{Z_o l}{v} + \frac{1}{\omega^2 C}\right) \quad (3)$$

As understood from the formula (3), it is possible to realize the wide band by reducing the characteristics impedance $Z_o$ of the transmission line, reducing the electrical length l, reducing the loss coefficient α, or increasing the capacitance C in the formula (3). As described above, according to the electromagnetic coupler of the present invention, it is possible to control the rate of variation of the matching condition to the frequency. Further, since it is possible to carry out the matching adjustment easily as described above, it is possible to adjust the frequency band.

Figure 2A:
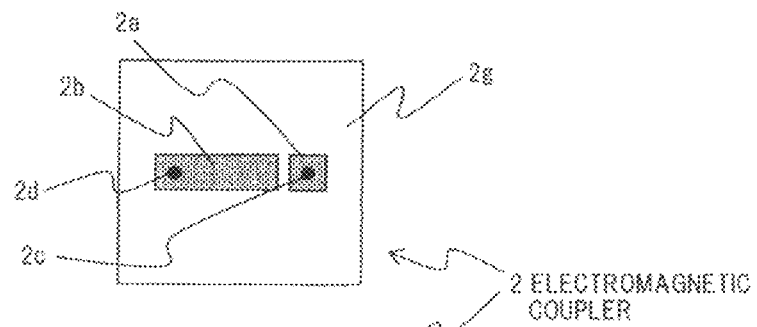
FIGS. 2A and 2B are explanatory diagrams showing an electromagnetic coupler in a first embodiment according to the present invention.
Figure 2B:
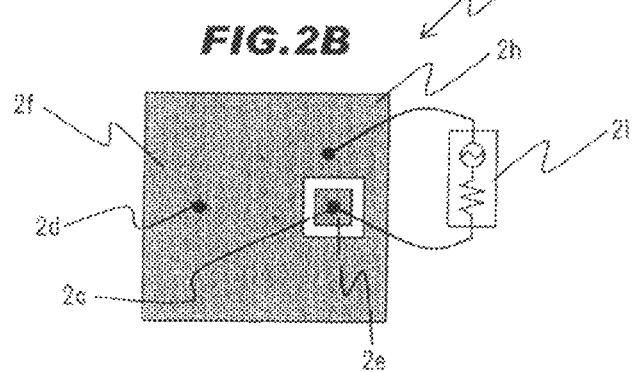

Further, since the structure shown in FIG. 1 is a simple configuration comprising the transmission line and the capacitor, it is possible to realize this structure in a double-layered printed board in the first embodiment according to the present invention as shown in FIGS. 2A and 2B, for example.

(First Embodiment)

Next, an electromagnetic coupler 2 in the first embodiment according to the present invention will be explained referring to FIGS. 2A and 2B.

In the present embodiment, the electromagnetic coupler 2 comprises a double-layered printed board comprising a first layer 2g in which conductors are formed on one face, and a second layer 2h in which conductors are formed on another face.

FIG. 2A is a plan view showing the first layer 2g of the electromagnetic coupler 2, and FIG. 2B is a transparent view of the second layer 2h of the electromagnetic coupler 2 viewed from a side of the first layer 2g.

Referring to FIGS. 2A and 2B, in the electromagnetic coupler 2, a first conductor pattern 2a and a second conductor pattern 2b which is separated from the first conductor pattern 2a are formed in the first layer 2g of the printed board comprising the dielectric material, while a feeding pattern 2e comprising a conductor and being connected to a feeding system 2i and a ground 2f comprising a conductor and being separated from the feeding pattern 2e are formed in the second layer 2h of the printed board.

A linear conductor 2c and a linear conductor 2d that are formed to be vertical to the second layer 2h (and the ground 2f) electrically connect between the first conductor pattern 2a and the feeding pattern 2e, and between the second conductor pattern 2b and the ground 2f, respectively. The linear conductors 2c, 2d are conductors formed inside of through-holes formed in the printed board. The linear conductors 2c, 2d may be filled inside of the through-holes, or may be provided thinly on an inner surface of the through-holes.

The linear conductor 2c is connected to the first conductor pattern 2a at one end, and connected to the feeding pattern 2e at another end. Therefore, the linear conductor 2c electrically connects between the first conductor pattern 2a and the feeding pattern 2e. The linear conductor 2d is connected to the second conductor pattern 2b at one end, and connected to the ground 2f at another end. Therefore, the linear conductor 2d electrically connects between the second conductor pattern 2b and the ground 2f. According to this structure, an electric power is fed between the feeding pattern 2e and the ground 2f. In addition, a gap (space) between the first conductor pattern 2a and the second conductor pattern 2b functions as a capacitor 1a in FIG. 1, and the second conductor pattern 2b functions as the transmission line 1b in FIG. 1.

Electric power can be fed from the feeding system 2i to the electromagnetic coupler 2 via e.g. coaxial cable. For this case, a center conductor of the coaxial cable is connected to the feeding pattern 2e, and an outer conductor of the coaxial cable is connected to the ground 2f. By feeding the electric power from the feeding system 2i to the electromagnetic coupler 2, electric current is flown through the first conductor pattern 2a, the second conductor pattern 2b and the linear conductors 2c, 2d. The longitudinal wave component of the electromagnetic wave generated from the electric current flown through the linear conductors 2c, 2d is emitted along a direction parallel to the two linear conductors 2c, 2d. Magnitude of the longitudinal wave component is in a positive correlation with matching condition between the electromagnetic coupler 2 and the feeding system 2i. As described above, since the magnitude of the longitudinal wave component of the electromagnetic wave can be adjusted easily in the electromagnetic coupler 2 of the present invention, it is possible to realize a sufficient data transmission. Further, since the electromagnetic coupler 2 does not use the band pass filter structure which has been used in the conventional device, it is possible to reduce deterioration of the data transmission characteristics due to the variation of the dielectric constant between the electromagnetic couplers.

In the conventional electromagnetic coupler, an electrode, a series inductor, a parallel inductor and a capacitor are required for realizing the band pass filter, in which the electrode is located in a layer which is geometrically independent from the series inductor, the parallel inductor and the ground. As one of techniques for embodying this structure, there is a technique of forming the series and parallel inductors in one layer of a double-layered printed board, forming the ground in another layer, and connecting another electrode to the series and parallel inductors and the ground. There is another technique of forming a series inductor, a parallel inductor, and a ground in respective layers of a triple-layered printed board, and connecting between the electrode and the inductors via linear conductors. However, according to the aforementioned techniques, the configuration of the electromagnetic coupler is complicated, and fabrication cost is increased. On the other hand, in the present invention, it is possible to realize the electromagnetic coupler by using the double-layered printed board as in the first embodiment. For example, it is possible to use a printed board or the like, in which FR4 (Flame Retardant Type 4 glass-epoxy substrate) is provided as interposing material. Therefore, according to the invention, it is possible to realize the electromagnetic coupler with simple structure and low cost.

As described above, according to the first embodiment of the present invention, it is possible to realize the electromagnetic coupler in which the data transmission characteristics hardly depends on the variation in the dielectric constant between the electromagnetic coupler and the other electromagnetic coupler that carries out the data transmission. As a result, even if the electromagnetic coupler is installed in the equipment covered with a cover including the dielectric material, the deterioration of the data transmission characteristics can be reduced. Therefore, it is possible to adapt the electromagnetic coupler to more kinds of the communication devices easily.

In addition, it is possible to realize the electromagnetic coupler, in which the matching adjustment with the feeding system can be easily carried out while maintaining the data transmission efficiency similar to the conventional device. Accordingly, although the adjustment of the frequency characteristics of the electromagnetic coupler is required according to the space or surrounding environment of the location of the electromagnetic coupler when the electromagnetic coupler is installed in the equipment, a time required for the matching adjustment with the feeding system can be reduced, since it is possible to easily carry out the matching adjustment with the feeding system. Therefore, it is possible to promptly provide the electromagnetic coupler which is optimized.

(Second Embodiment)

FIGS. 3A and 3B are explanatory diagrams showing an electromagnetic coupler 3 in the second embodiment according to the present invention.

In the structure shown in FIGS. 2A and 2B, the data transmission over the short distance is carried out by using the longitudinal wave component of the electromagnetic wave which is generated from the electric current flown through the two linear conductors 2c, 2d and is parallel to the linear conductors 2c, 2d. In the meantime, the transversal wave is generated from the electric current flown through the second conductor pattern 2b. The attenuation amount with respect to the distance is smaller than that of the longitudinal wave, so that communication over the long distance can be carried out, thereby interfering other communication system. In order to avoid this problem, configurations of the first conductor pattern 2a and the second conductor pattern 2b in FIGS. 2A and 2B are changed as shown in FIGS. 3A and 3B.

More concretely, in the electromagnetic coupler 3, a first conductor pattern 3a and a second conductor pattern comprising two rectangular conductor patterns 3b, 3c that are separated from the first conductor pattern 3a are formed in a first layer 3*i* of a printed board, while a feeding pattern 3*g* comprising a conductor and being connected to a feeding system 3*k* and a ground 3*h* comprising a conductor and being separated from the feeding pattern 3*g* are formed in a second layer 3*j* of the printed board. A linear conductor 3*d* that is formed to be vertical to the second layer 3*j* electrically connects between the first conductor pattern 3*a* and the feeding pattern 3*g*. Linear conductors 3*e*, 3*f* that are formed to be vertical to the second layer 3*j* electrically connects between the conductor patterns 3*b*, 3*c* composing the second conductor pattern and the ground 3*h*. The linear conductors 3*d*, 3*e*, 3*f* are conductors formed inside of through-holes formed in the printed board. The linear conductor 3*d* is connected to the first conductor pattern 3*a* at one end, and connected to the feeding pattern 3*g* at another end. The linear conductors 3*e*, 3*f* are connected to the conductor patterns 3*b*, 3*c* composing the second conductor pattern at one end, and connected to the ground 3*h* at another end. According to this structure, the electric power is fed between the feeding pattern 3*g* and the ground 3*h*.

The conductor patterns 3*b*, 3*c* composing the second conductor pattern have the same shape, and the conductor patterns 3*b*, 3*c* are located to sandwich the first conductor pattern 3*a*. In other words, the first conductor pattern 3*a* is formed between the conductor patterns 3*b*, 3*c*. By arranging the conductor patterns 3*b*, 3*c* in the above manner, it is possible to offset the transversal wave component of the electromagnetic wave generated from the electric current flown through the conductor patterns 3*b*, 3*c*, thereby reducing the transversal wave component. More particularly, when the first conductor pattern 3*a* and the two conductor patterns 3*b*, 3*c* are point-symmetrical in shape and location with respect to a connecting point between the conductor pattern 3*a* and the linear conductor 3*d*, and when the linear conductors 3*d*, 3*e*, 3*f* are point-symmetrical in location with respect to a connecting point between the conductor pattern 3*a* and the linear conductor 3*d*, the electric current is flown through the conductor pattern 3*b* and the conductor pattern 3*c* in opposite directions, respectively and the magnitude of the electric current therefor is equal to each other. Therefore, it is possible to further reduce the transversal component of the electromagnetic wave generated from the electric current flown through the conductor patterns 3*b*, 3*c*. Further, in the present embodiment, the ground 3*h* is formed to surround the feeding pattern 3*g*. According to this structure, it is possible to obtain the effect that the transversal wave is further hardly generated.

(Second Model of the Electromagnetic Coupler)

Another model of the electromagnetic coupler 3 in the second embodiment can be schematically illustrated as an electromagnetic coupler 4 in FIG. 4.

Input impedance $Z_{in}'$ of an electromagnetic coupler 4 shown in FIG. 4 can be approximated according to formula (4):

$$Z_{in}' = 0.5\left[\frac{Z_o' l' \alpha' \omega}{v} + j\left(\frac{Z_o' l' \omega}{v} - \frac{1}{\omega C'}\right)\right] \quad (4)$$

wherein characteristics impedance of the transmission lines 4*b*, 4*d* is $Z_o'$, loss coefficient of the transmission lines 4*b*, 4*d* is $\alpha'$, electrical length of the transmission lines 4*b*, 4*d* is l', capacitance is C', velocity of electromagnetic wave is v, and angle frequency is ω, under condition that ω·l'/v<<1 is established.

As understood from the formula (4), the input impedance $Z_{in}'$ of the structure shown in FIG. 4 is similar to that of the structure shown in FIG. 1. Therefore, according to the electromagnetic couplers shown in FIGS. 3A, 3B and 4, it is possible to carry out the matching adjustment and the frequency band adjustment easily, similarly to the electromagnetic couplers shown in FIGS. 1, 2A and 2B.

(Third Embodiment)

Figure 5A:
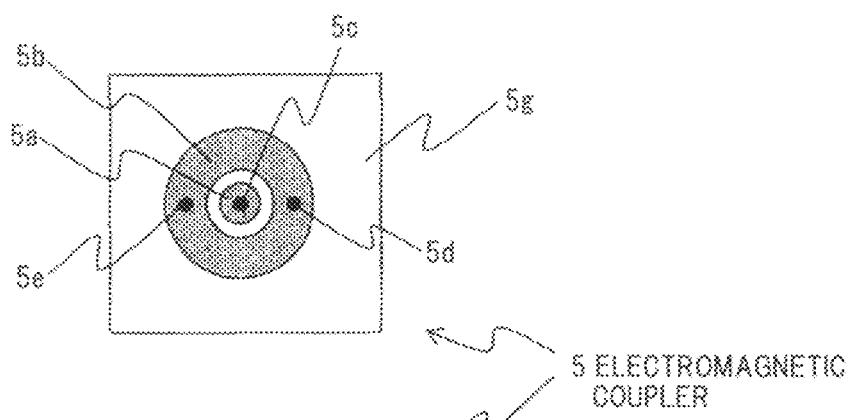
FIGS. 5A and 5B are explanatory diagrams showing an electromagnetic coupler in a third embodiment according to the present invention.
Figure 5B:
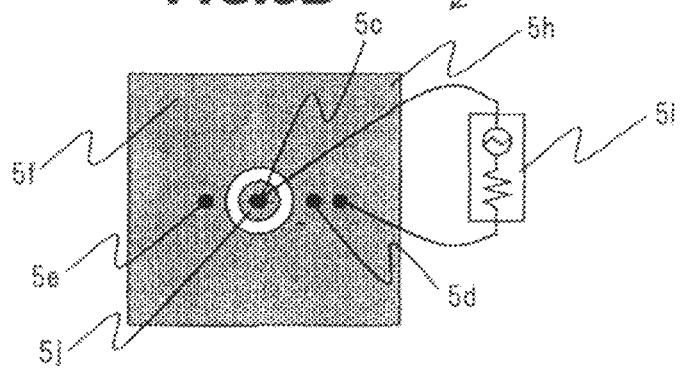

FIGS. 5A and 5B are explanatory diagrams showing an electromagnetic coupler 5 in the third embodiment according to the present invention.

In the third embodiment, the electromagnetic coupler 5 comprises a double-layered printed board comprising a first layer 5*g* in which conductors are formed on one face, a second layer 5*h* in which conductors are formed on another face, and a dielectric material as an interposing material.

In the electromagnetic coupler 5, a first conductor pattern 5*a* and a second conductor pattern 5*b* which is separated from the first conductor pattern 5*a* and formed in annular shape to surround the first conductor pattern 5*a* are formed in the first layer 5*g* of the printed board, while a feeding pattern 5*j* comprising a conductor and being connected to a feeding system 5*i* and a ground 5*f* comprising a conductor and being separated from the feeding pattern 5*j* are formed in the second layer 5*h* of the printed board. In the present embodiment, the first conductor pattern 5*a* is formed to have a circular shape, and the second conductor pattern 5*b* is formed to have an annular shape.

A linear conductor 5*c* that is formed to be vertical to the second layer 5*h* electrically connects between the first conductor pattern 5*a* and the feeding pattern 5*j*. Namely, the linear conductor 5*c* is connected to the first conductor pattern 5*a* at one end, and connected to the feeding pattern 5*j* at another end. Two linear conductors 5*d*, 5*e* that are formed to be vertical to the second layer 5*h* electrically connects between the second conductor patterns 5*b* and the ground 5*f*. Namely, the linear conductors 5*d*, 5*e* are connected to the second conductor pattern 5*b* at one end, and connected to the ground 5*f* at another end. The linear conductors 5*c*, 5*d*, 5*e* are conductors formed inside of through-holes formed in the printed board.

The electromagnetic coupler 5 in the present embodiment has characteristics similar to those of the electromagnetic coupler 3 in the second embodiment. However, since a capacitor is realized by the first conductor pattern 5*a* and the second conductor pattern 5*b* surrounding the first conductor pattern 5*a*, length of facing sides of the first and second conductor patterns 5*a*, 5*b* is increased. Therefore, it is possible to easily obtain a larger capacitance value compared with the electromagnetic coupler 3 in the second embodiment. Accordingly, as understood from the formulas (1) and (4), a resonant frequency (angle frequency ω) in which the imaginary component of the input impedance of the electromagnetic coupler is zero (0) is reduced. Therefore, according to the present embodiment, it is possible to downsize the electromagnetic coupler.

Further, it is possible to further reduce the transversal component of the electromagnetic wave generated in the electromagnetic coupler 5, by locating the first conductor pattern 5*a* and the second conductor pattern 5*b* to be point-symmetrical in shape and location with respect to a connecting point between the linear conductor 5*c* and the first conductor pattern 5*a*, and disposing the linear conductors 5*c*, 5*d*, 5*e* to be point-symmetrical in location with respect to the connecting point between the linear conductor 5*c* and the first conductor pattern 5*a*.

(Experimental Result of the Third Embodiment)

Next, experimental result about the third embodiment according to the present invention will be explained below.

Figure 6:
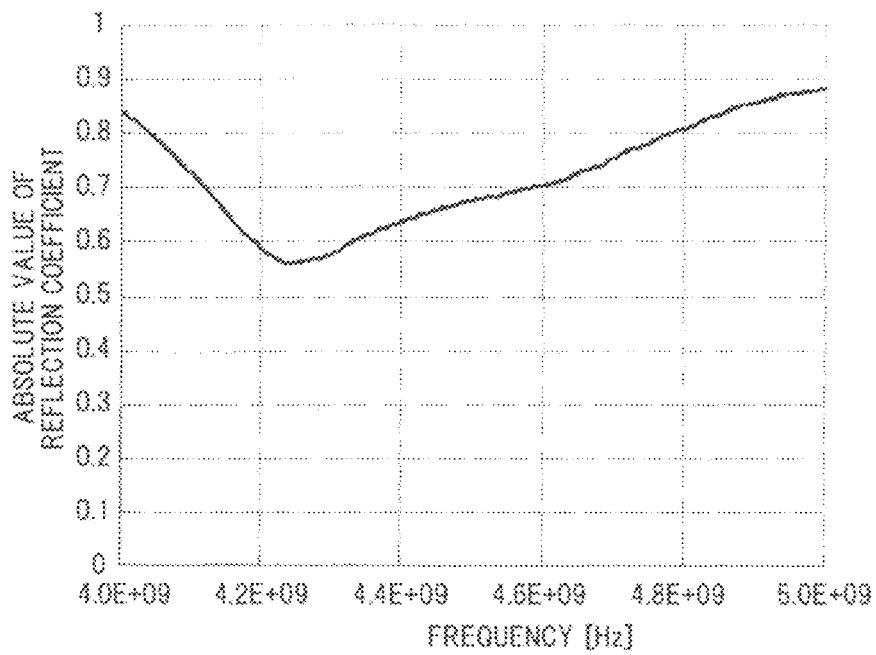
FIG. 6 is a graph showing experimental result about a relationship between a frequency and an absolute value of reflection coefficient of the electromagnetic coupler in the third embodiment according to the invention.

FIG. 6 is a graph showing the experimental result about the relationship between a frequency and an absolute value of reflection coefficient of the electromagnetic coupler 5 in the third embodiment according to the invention.

Figure 8:
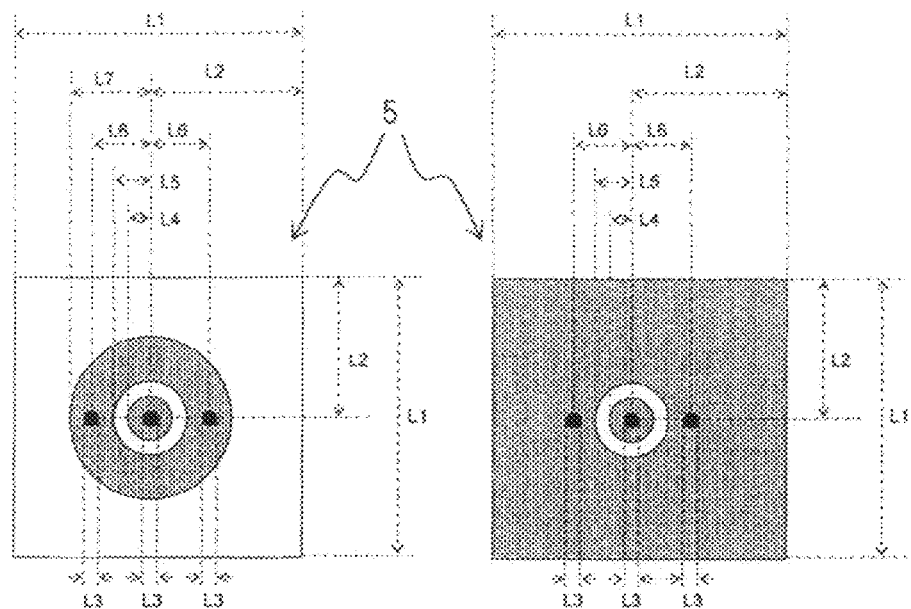
FIG. 8 is an explanatory diagram showing dimensions of the electromagnetic coupler in the third embodiment to be used in the experiments shown in FIG. 6 and FIG. 7.

In this experiment, the electromagnetic coupler 5 having a configuration shown in FIG. 8 was employed. The electromagnetic coupler 5 is formed by using the FR4 two-side (double-layered) substrate having a thickness of 3.4 mm. Herein, L1=20.0 mm, L2=10.0 mm, L3=1.0 mm, L4=2.2 mm, L5=2.7 mm, L6=4.35 mm, and L7=5.4 mm. The absolute value of the reflection coefficient was measured by using a network analyzer.

According to the experimental result shown in FIG. 6, the absolute value of the reflection coefficient is equal to or less than 0.8 within a range of frequency of 4.1 GHz to 4.7 GHz. Therefore, it is understood from the experimental result that the frequency characteristics for wide band are realized by the electromagnetic coupler 5.

Figure 7:
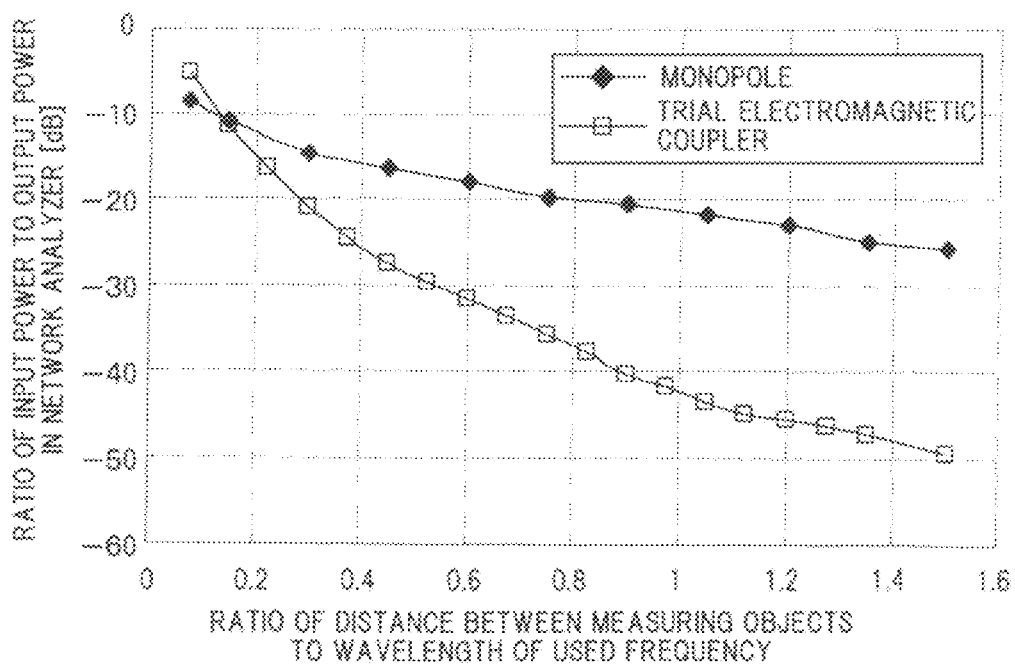
FIG. 7 is a graph showing experimental result about a relationship between a ratio of an input power to an output power of a monopole antenna or electromagnetic coupler and a distance between the monopole antennas or electromagnetic couplers in the third embodiment according to the invention.

FIG. 7 is a graph showing experimental result about the relationship between a ratio of an input power to an output power of monopole antenna 9 or electromagnetic coupler 5 and a distance between the monopole antennas 9 or the electromagnetic couplers 5 in the third embodiment according to the invention.

In this experiment, the electromagnetic coupler 5 which is same as the electromagnetic coupler used in the experiment of FIG. 6 was employed. Further, in this experiment, the monopole antenna 9 shown in FIG. 9 was employed. The monopole antenna 9 comprises a printed board 9a, and two rectangular conductors 9b, 9c formed on a surface of the printed board 9a. The two rectangular conductors 9b, 9c are formed to be separated from each other, and the rectangular conductor 9b functions as radiating conductor while the rectangular conductor 9c functions as ground. Electric power is fed between the rectangular conductor 9b and the rectangular conductor 9c. The monopole antenna 9 is formed by using FR4 one-side substrate having a thickness of 2.4 mm. Herein, L'1=22.0 mm, L'2=10.0 mm, L'3=11.0 mm, L'4=20.0 mm, L'5=9.5 mm, and L'6=1.0 mm. The monopole antenna 9 is a widely-used antenna, and applicable to the radio communication using the transversal wave.

Figure 10:
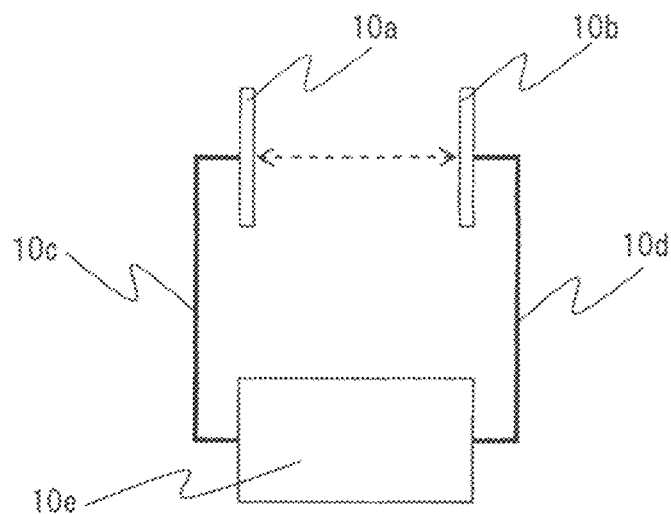

Referring to FIG. 10, an experiment system will be described below. In the experiment, two measuring objects (objects to be measured) 10a, 10b, i.e. two electromagnetic couplers 5 or two monopole antennas 9 are disposed to face to each other in geometrically parallel directions, such that a perpendicular passing through a center of one measuring object 10a passes through a center of another measuring object 10b. The measuring objects 10a, 10b are connected to two terminals of a network analyzer 10e via coaxial cables 10c, 10d, respectively. In this experiment, a ratio of an input power that is input at one terminal of the network analyzer 10 to an output power of that is output at another terminal of the network analyzer 10 (absolute value of S21, herein "S21" is a parameter indicating a ratio of signal reflection from port 1 to port 2) is evaluated. Namely, a ratio of the input power to the output power of the electromagnetic coupler or monopole antenna is evaluated.

Figure 9:
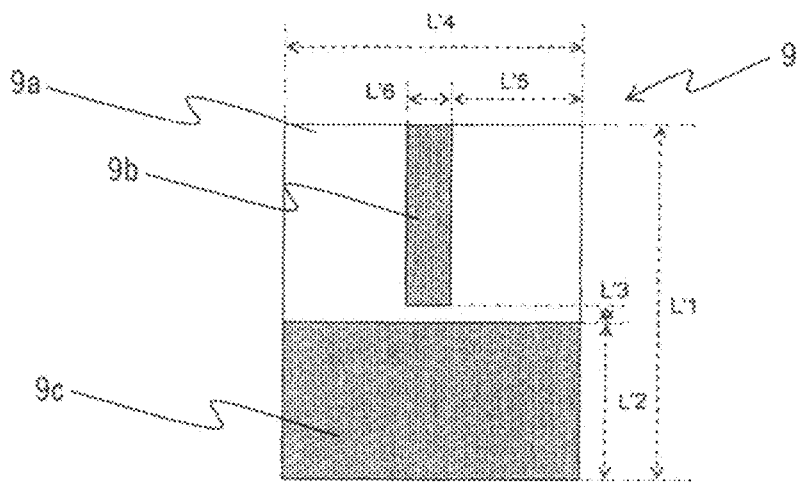
FIG. 9 is an explanatory diagram showing dimensions of the monopole antenna to be used in the experiment shown in FIG. 7.

FIG. 7 shows the relationship between the distance and the absolute value of S21 between the two electromagnetic couplers 5 shown in FIG. 8, or between the two monopole antennas 9 shown in FIG. 9. In this experiment, signals at a frequency of 4.5 GHz was used, and a horizontal axis in FIG. 7 shows the ratio of the distance between the measuring objects to the wavelength of the used frequency As clearly understood from FIG. 7, in the electromagnetic coupler 5 in the third embodiment according to the present invention, an incli-nation of the absolute value of S21 to the distance is greater than that of the monopole antenna 9 which carries out the radio communication with using the transversal wave, since the electromagnetic coupler 5 carries out the radio communication with using the longitudinal wave, and the attenuation of the longitudinal wave with respect to the distance is greater than that of the transversal wave. For example, when the ratio of the distance between the measuring objects with respect to the wavelength is around 1.5, the absolute value of S21 of the electromagnetic coupler 5 is smaller by about 23 dB than that of the monopole antenna 9. It is understood that performance of the radio communication of the electromagnetic coupler 5 is lower than that of the monopole antenna 9 in this range. On the other hand, when the ratio of the distance between the measuring objects with respect to the wavelength is around 0.1, the absolute value of S21 of the electromagnetic coupler 5 is greater than that of the monopole antenna 9. It is understood that performance of the radio communication of the electromagnetic coupler 5 is as good as that of the monopole antenna 9 in this range.

(Fourth Embodiment)

Figure 11A:
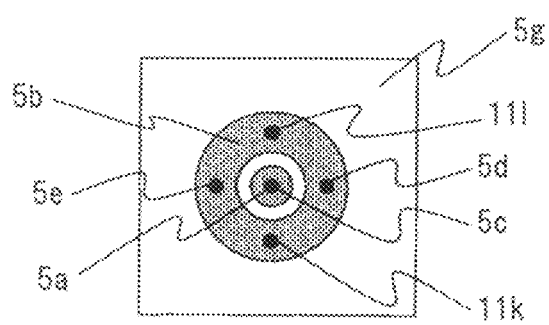
FIGS. 11A and 11B are explanatory diagrams showing an electromagnetic coupler in a fourth embodiment of the present invention.
Figure 11B:
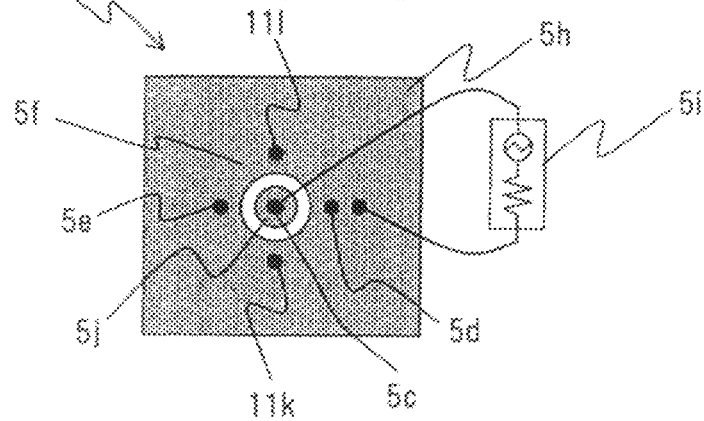

An electromagnetic coupler 11 in the fourth embodiment according to the present invention will be explained below referring to FIGS. 11A and 11B. In the fourth embodiment, two linear conductors 11k and 11l are added to the third embodiment. Same reference numerals are assigned to the same parts as the third embodiment, and explanation thereof is omitted.

Namely, the two linear conductors 11k, 11l are formed to be vertical to the second layer 5h of the printed board (i.e. vertical to the ground 50. The two linear conductors 11k, 11l are connected to the second conductor pattern 5b at one end, and connected to the ground 5f at another end. As described above, it is possible to change the electrical length l of the transmission line in the formulas (1) and (4), by increasing or decreasing the number of the linear conductors (the number of the linear conductors is increased in the present embodiment). Therefore, it is possible to improve the matching, even when the matching adjustment by the loss coefficient α and the capacitance C is difficult as in the third embodiment, due to the problems such as surrounding environment, substrate material, or dimensions of the electromagnetic coupler.

In the fourth embodiment, the number of the linear conductors that are not connected to the feeding pattern 5j is four (4) in total. However, the number of the linear conductors may be changed from four in order to enhance the matching adjustment. When the number of the linear conductors is N (N≥2), the linear conductors may be indicated as s(1), s(2), ... s(N). It is possible to emit the longitudinal wave component of the electromagnetic wave radiated from the linear conductors without polarization, by disposing the linear conductors in such a manner that angles made by adjacent linear conductors, e.g. linear conductor s(m) and s(m+1), are equal to each other (equiangular) with respect to the linear conductor 5c connected to the feeding pattern 5j as an apex. Therefore, it is possible to reduce the dispersion in the communication performance according to the orientation.

Further, similarly to the second embodiment, it is possible to further reduce the transversal component of the electromagnetic wave generated in the electromagnetic coupler 11, by locating the first conductor pattern 5a and the second conductor pattern 5b to be point-symmetrical in shape and location with respect to a connecting point between the linear conductor 5c' and the first conductor pattern 5a, and disposing the linear conductors 5c, 5d, 5e, 11k, 11l to be point-symmetrical in location with respect to the connecting point between the linear conductor 5c and the first conductor pattern 5a.

(Fifth Embodiment)

Figure 12A:
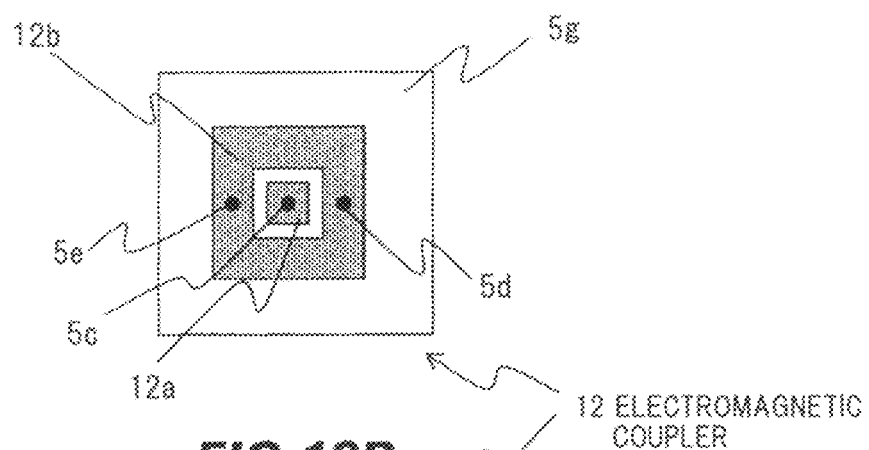
FIGS. 12A and 12B are explanatory diagrams showing an electromagnetic coupler in a fifth embodiment of the present invention.
Figure 12B:
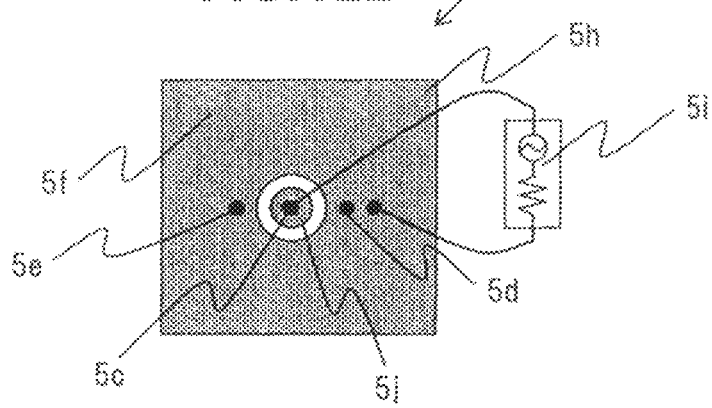

An electromagnetic coupler 12 in the fifth embodiment according to the present invention will be explained below referring to FIGS. 12A and 12B. In the electromagnetic coupler 12 of the fifth embodiment, the shapes of the first conductor pattern 5a and the second conductor pattern 5b of the electromagnetic coupler 5 in the third embodiment are changed.

Namely, in the electromagnetic coupler 12 of the fifth embodiment, the first conductor pattern 12a is formed to have a rectangular shape, and the second conductor pattern 12b is formed to have a rectangular shape. An inner periphery of the second conductor pattern 12b is facing to an outer periphery of the first conductor pattern 12a. In the same area as the first layer of the electromagnetic coupler 5 of the third embodiment, it is possible to change parameters in the formulas (1) and (4), i.e. the electrical length l, loss coefficient α, and characteristics impedance $Z_o$, by providing the first conductor pattern 12a and the second conductor pattern 12b with the shapes shown in FIGS. 12A and 12B. Therefore, it is possible to improve the matching, even when the matching condition is not good due to the surrounding environment or the like.

Further, it is possible to further reduce the transversal component of the electromagnetic wave generated in the electromagnetic coupler 12, by locating the first conductor pattern 12a and the second conductor pattern 12b to be point-symmetrical in shape and location with respect to a connecting point between the linear conductor 5c and the first conductor pattern 12a, and disposing the linear conductors 5c, 5d, 5e to be point-symmetrical in location with respect to the connecting point between the linear conductor 5c and the first conductor pattern 12a.

(Sixth Embodiment)

Figure 13A:
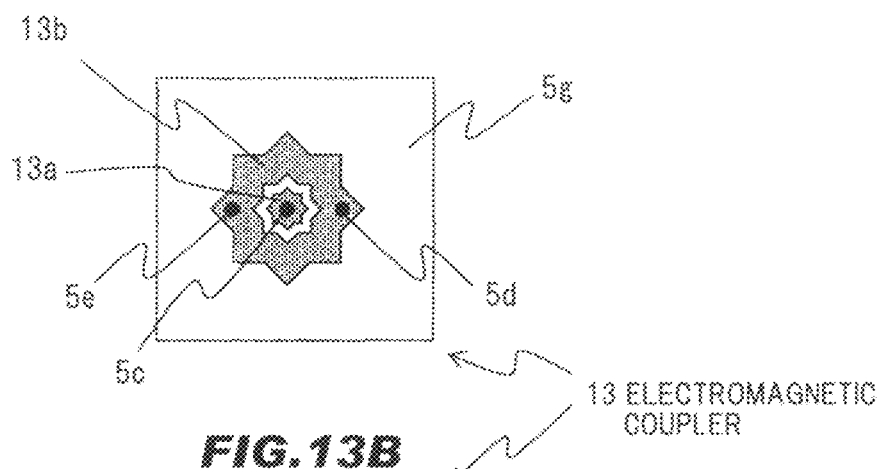
FIGS. 13A and 13B are explanatory diagrams showing an electromagnetic coupler in a sixth embodiment of the present invention.
Figure 13B:
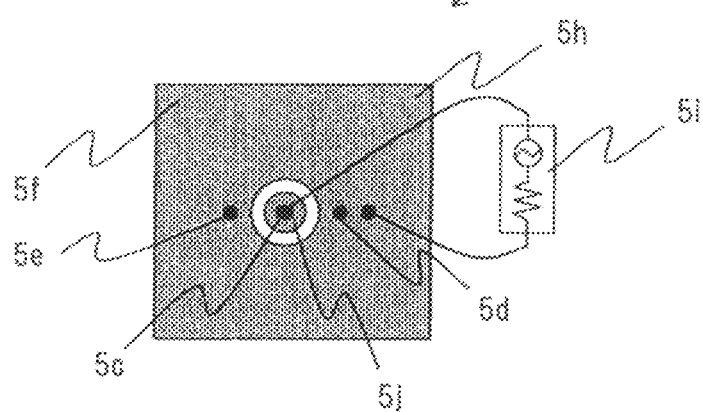

An electromagnetic coupler 13 in the sixth embodiment according to the present invention will be explained below referring to FIGS. 13A and 13B. In the electromagnetic coupler 13 of the sixth embodiment, the shapes of the first conductor pattern 5a and the second conductor pattern 5b of the electromagnetic coupler 5 in the third embodiment are changed. Namely, in the electromagnetic coupler 13 of the fifth embodiment, the first conductor pattern 13a is formed to have a star-like shape with a plurality of protrusions, and the second conductor pattern 13b is formed to have a star-like shape. An inner periphery of the second conductor pattern 13b faces and corresponds to an outer periphery of the first conductor pattern 13a. In the same area as the first layer of the electromagnetic coupler 5 of the third embodiment, it is possible to change parameters in the formulas (1) and (4), i.e. the electrical length l, loss coefficient α, and characteristics impedance $Z_o$, by providing the first conductor pattern 12a and the second conductor pattern 12b with the shapes shown in FIGS. 13A and 13B. Therefore, it is possible to improve the matching, even when the matching condition is not good due to the surrounding environment or the like.

The length of facing sides of the first and second conductor patterns 13a, 13b is increased compared with those of the electromagnetic coupler 5 in the third embodiment. Therefore, it is possible to easily obtain a larger capacitance value compared with the electromagnetic coupler 5 in the third embodiment. Accordingly, as understood from the formulas (1) and (4), a resonant frequency (angle frequency ω) in which the imaginary component of the input impedance of the electromagnetic coupler is zero (0) is reduced. Therefore, according to the present embodiment, it is possible to downsize the electromagnetic coupler 13.

Further, it is possible to further reduce the transversal component of the electromagnetic wave generated in the electromagnetic coupler 13, by locating the first conductor pattern 13a and the second conductor pattern 13b to be point-symmetrical in shape and location with respect to a connecting point between the linear conductor 5c and the first conductor pattern 13a, and disposing the linear conductors 5c, 5d, 5e to be point-symmetrical in location with respect to the connecting point between the linear conductor 5c and the first conductor pattern 13a.

(Seventh Embodiment)

Figure 14A:
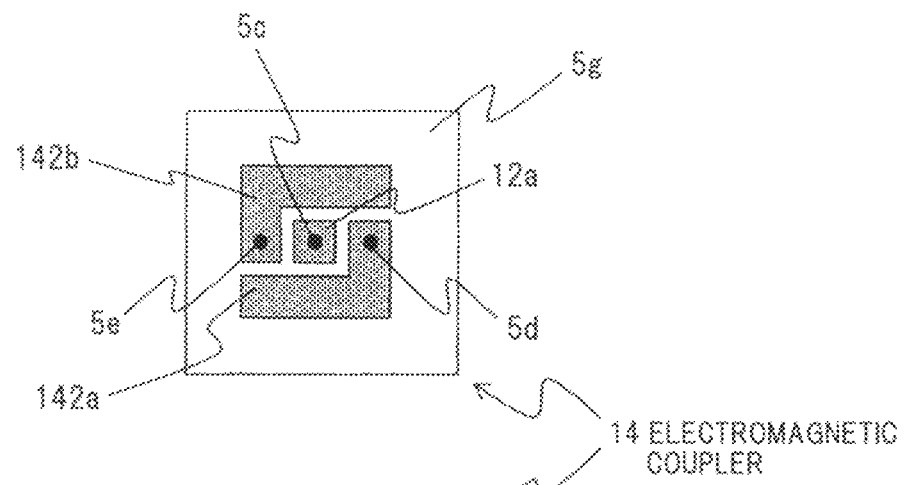
FIGS. 14A and 14B are explanatory diagrams showing an electromagnetic coupler in a seventh embodiment of the present invention.
Figure 14B:
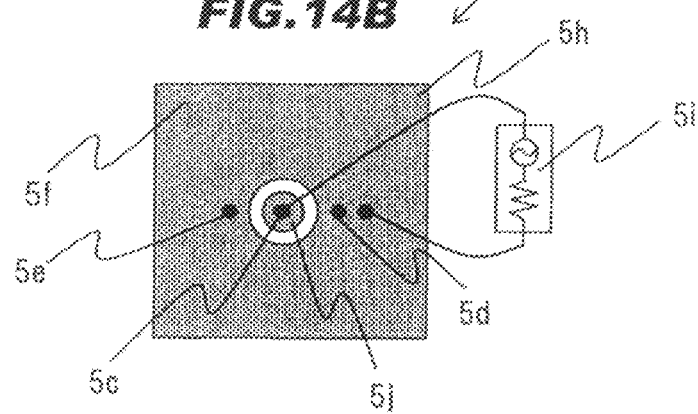

An electromagnetic coupler 14 in the seventh embodiment according to the present invention will be explained below referring to FIGS. 14A and 14B. In the electromagnetic coupler 14 of the seventh embodiment, the second conductor pattern 12b of the electromagnetic coupler 12 in the fifth embodiment is bisected in a circumferential direction to provide conductor patterns 141b, 142b. Namely, the first conductor pattern 12a is formed to have a rectangular shape, and the second conductor pattern comprises two L-shaped conductor patterns 141b, 142b. The input impedance $Z_{in}$ of the electromagnetic coupler 14 can be expressed by the formulas (1) and (4) even though the shape of the second conductor pattern is transformed. The electromagnetic coupler 14 has the characteristics similar to those of the electromagnetic coupler 12 in the fifth embodiment.

Further, it is possible to further reduce the transversal component of the electromagnetic wave generated in the electromagnetic coupler 14, by locating the first conductor pattern 12a and the two conductor patterns 141b, 142b composing the second conductor pattern to be point-symmetrical in shape and location with respect to a connecting point between the linear conductor 5c and the first conductor pattern 12a, and disposing the linear conductors 5c, 5d, 5e to be point-symmetrical in location with respect to the connecting point between the linear conductor 5c and the first conductor pattern 12a.

Still further, in the present embodiment, it is possible to increase particularly the electrical length l in the formulas (1) and (4) compared with the fifth embodiment, so that it is possible to downsize the electromagnetic coupler 14.

(Eighth Embodiment)

Figure 15A:
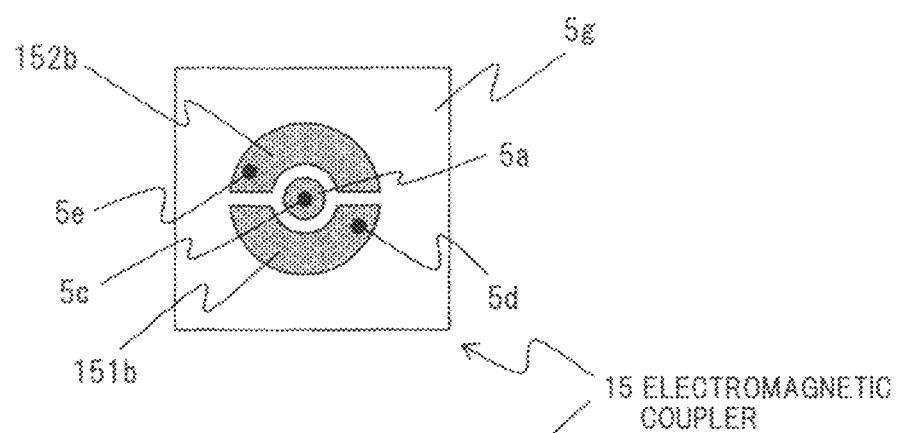
FIGS. 15A and 15B are explanatory diagrams showing an electromagnetic coupler in an eighth embodiment of the present invention.
Figure 15B:
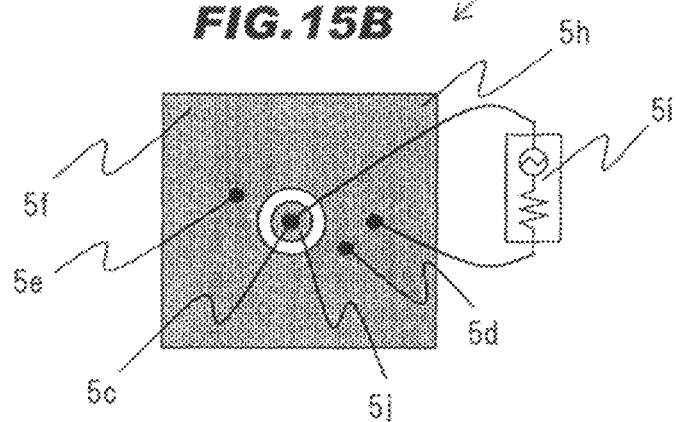

An electromagnetic coupler 15 in the eighth embodiment according to the present invention will be explained below referring to FIGS. 15A and 15B. In the electromagnetic coupler 15 of the eighth embodiment, the second conductor pattern 5b of the electromagnetic coupler 5 in the third embodiment is bisected in a circumferential direction to provide conductor patterns 151b, 152b. Namely, the first conductor pattern 5a is formed to have a circular shape, and the second conductor pattern comprises two semicircular-shaped conductor patterns 151b, 152b. The input impedance $Z_{in}$ of the electromagnetic coupler 15 can be expressed by the formulas (1) and (4) even though the shape of the second conductor pattern is transformed. The electromagnetic coupler 15 has the characteristics similar to those of the electromagnetic coupler 5 in the third embodiment.

Further, it is possible to further reduce the transversal component of the electromagnetic wave generated in the electromagnetic coupler 15, by locating the first conductor pattern 5a and the two conductor patterns 151b, 152b composing the second conductor pattern to be point-symmetrical in shape and location with respect to a connecting point between the linear conductor 5c and the first conductor pattern 5a, and disposing the linear conductors 5c, 5d, 5e to be point-symmetrical in location with respect to the connecting point between the linear conductor 5c and the first conductor pattern 5a.

Still further, in the present embodiment, it is possible to increase particularly the electrical length l in the formulas (1) and (4) compared with the third embodiment, so that it is possible to downsize the electromagnetic coupler 15.

(Ninth Embodiment)

Figure 16A:
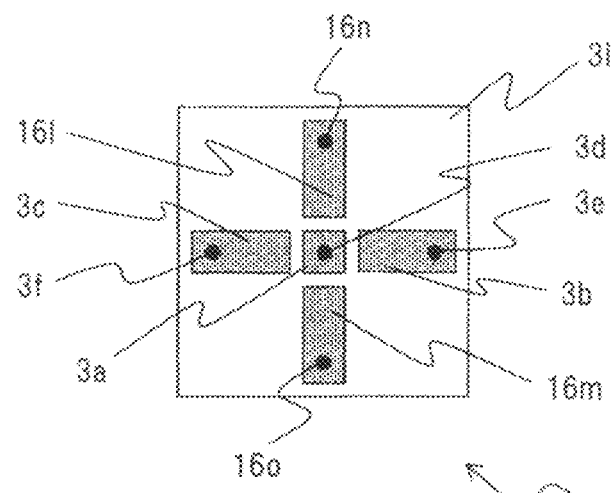
FIGS. 16A and 16B are explanatory diagrams showing an electromagnetic coupler in a ninth embodiment of the present invention.
Figure 16B:
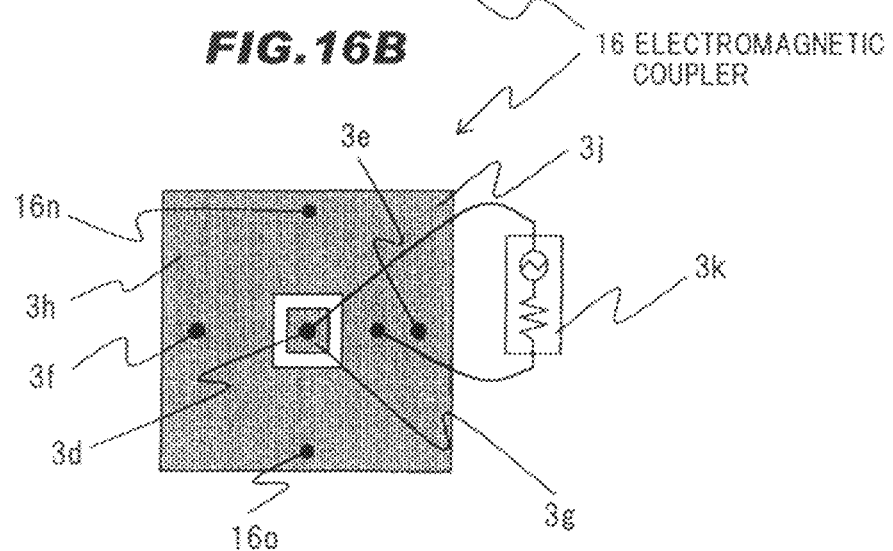

An electromagnetic coupler 16 in the ninth embodiment according to the present invention will be explained below referring to FIGS. 16A and 16B. In the ninth embodiment, two linear conductors 16l, 16m composing the second conductor pattern and liner conductors 16n, 16o are added to the electromagnetic coupler 3 in the third embodiment. The two linear conductors 16n, 16o are formed to be vertical to the second layer 3j of the printed board. The linear conductor 16n is connected to the conductor pattern 16l at one end, and connected to the ground 3h at another end. The linear conductor 16o is connected to the conductor pattern 16m at one end, and connected to the ground 3h at another end.

Herein, the linear conductors 16n, 16o are disposed in the first layer 3i, such that an angle of 90° is made by a straight line passing through the linear conductors 3d, 3e and 3f and a straight line passing through the linear conductors 16n, 3d, and 16o. In other words, the four linear conductors 3e, 3f, 16n and 16o are disposed in equiangular manner with angle of 90° with respect to a connecting point between the first conductor pattern 3a and the linear conductor 3d as a center. Further, the conductor patterns 16l, 16m are disposed along the straight line passing through the linear conductors 16n, 3d, and 16o. In other words, the four rectangular conductor patterns 3b, 3c, 16l, and 16m composing the second conductor pattern are disposed radially to face respective sides of an outer periphery of the first conductor pattern 3a.

By adding the conductor patterns 16l, 16m and the liner conductors 16n, 16o, it is possible to emit the longitudinal wave component of the electromagnetic wave radiated from the linear conductors without polarization compared with the electromagnetic coupler 3 in the second embodiment. Therefore, it is possible to reduce the dispersion in the communication performance according to the orientation. Further, it is also possible to add conductor patterns and linear conductors disposed radially to the linear conductor 3d as a center in the first layer 3i. In this case, it is possible to further reduce the longitudinal wave component of the electromagnetic wave emitted from the electromagnetic coupler.

(Tenth Embodiment)

Figure 17A:
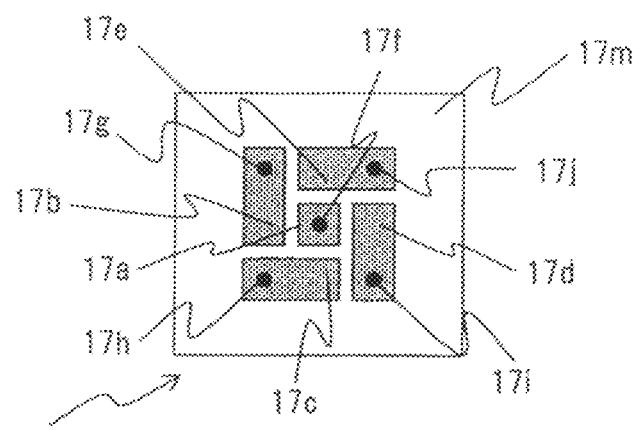
FIGS. 17A and 17B are explanatory diagrams showing an electromagnetic coupler in a tenth embodiment of the present invention.
Figure 17B:
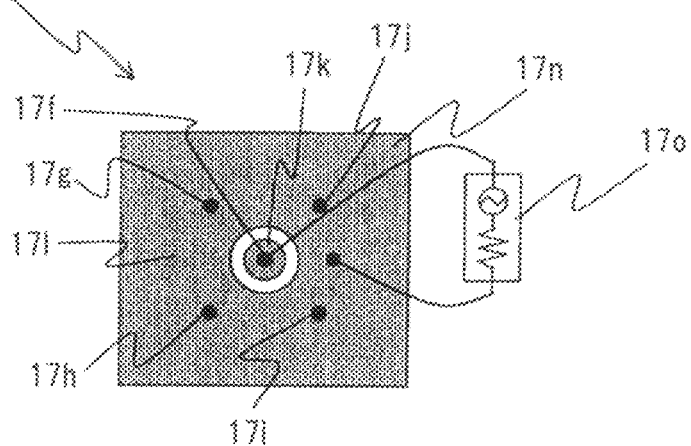

An electromagnetic coupler 17 in the tenth embodiment according to the present invention will be explained below referring to FIGS. 17A and 17B. In the electromagnetic coupler 17 of the tenth embodiment, the arrangement of the second conductor pattern and the linear conductors in the electromagnetic coupler 16 of the ninth embodiment are changed.

More concretely, in the electromagnetic coupler 17, a first conductor pattern 17a and a second conductor pattern comprising four rectangular conductor patterns 17b, 17c, 17d, 17e that are separated from the first conductor pattern 17a are formed in a first layer 17m of a printed board, while a feeding pattern 17k comprising a conductor and being connected to a feeding system 17o and a ground 17l comprising a conductor and being separated from the feeding pattern 17k are formed in a second layer 17n of the printed board. A linear conductor 17f that is formed to be vertical to the second layer 17n electrically connects between the first conductor pattern 17a and the feeding pattern 17k. Linear conductors 17g, 17h, 17i, 17j that are formed to be vertical to the second layer 17n electrically connects between the four conductor patterns 17b, 17c, 17d, 17e composing the second conductor pattern and the ground 17l. The linear conductors 17g, 17h, 17i, 17j are conductors formed inside of through-holes formed in the printed board. The linear conductors 17g, 17h, 17i, 17j are formed at respective apexes of a rectangle that is point-symmetrical with respect to a connecting point between the conductor pattern 17a and the linear conductor 17f. Further, the four conductor patterns 17b, 17c, 17d, 17e composing the second conductor pattern are disposed along respective sides of the rectangle in which the linear conductors 17g, 17h, 17i, 17j are provided at respective apexes. According to this structure, it is possible to effectively use a space in the first layer 17m, thereby downsizing the electromagnetic coupler 17.

(Eleventh Embodiment)

Figure 18A:
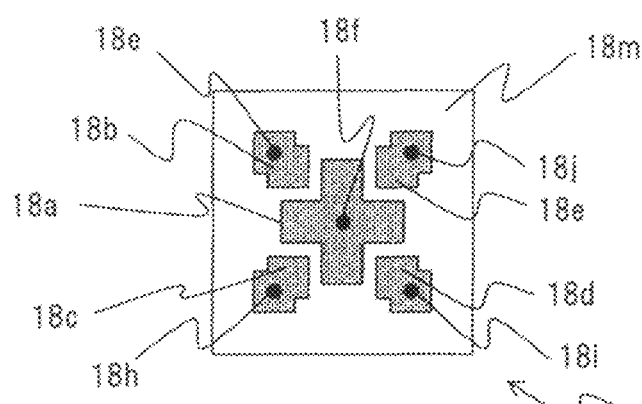
FIGS. 18A and 18B are explanatory diagrams showing an electromagnetic coupler in an eleventh embodiment of the present invention.
Figure 18B:
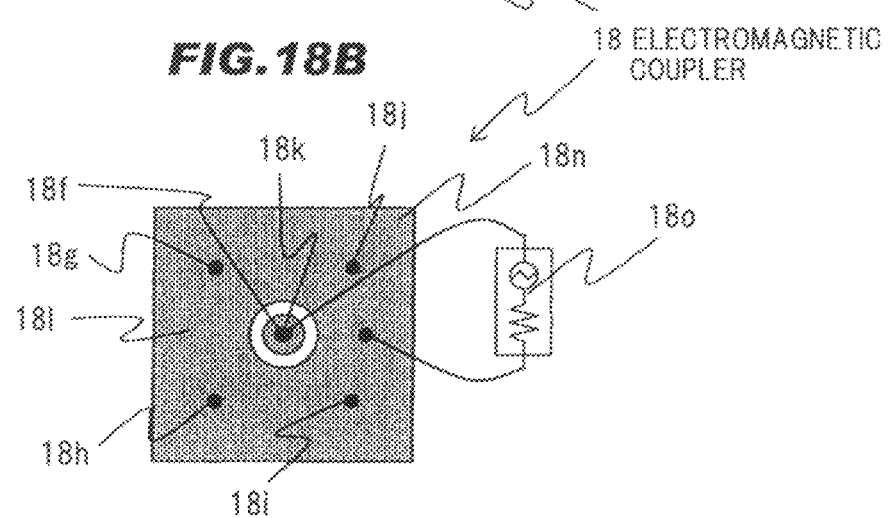

An electromagnetic coupler 18 in the eleventh embodiment according to the present invention will be explained below referring to FIGS. 18A and 18B. In the electromagnetic coupler 18 of the eleventh embodiment, the shapes of the first and second conductor patterns and the arrangement of the second conductor pattern and the linear conductors in the electromagnetic coupler 16 of the ninth embodiment are changed.

More concretely, in the electromagnetic coupler 18, a first conductor pattern 18a formed to have a cross-like shape and a second conductor pattern comprising four polygonal conductor patterns 18b, 18c, 18d, 18e that are separated from the first conductor pattern 18a are formed in a first layer 18m of a printed board, while a feeding pattern 18k comprising a conductor and being connected to a feeding system 18o and a ground 18l comprising a conductor and being separated from the feeding pattern 18k are formed in a second layer 18n of the printed board. A linear conductor 18f that is formed to be vertical to the second layer 18n electrically connects between the first conductor pattern 18a and the feeding pattern 18k. Linear conductors 18g, 18h, 18i, 18j that are formed to be vertical to the second layer 18n electrically connects between the four conductor patterns 18b, 18c, 18d, 18e composing the second conductor pattern and the ground 18l. The second conductor pattern has two dies facing to two sides of an outer periphery of the first conductor pattern 18a having the cross-like shape. In the electromagnetic coupler 18 of the present embodiment, it is possible to increase the capacitance, by increasing the number of the sides of the first conductor pattern 18 and the four conductor patterns 18b, 18c, 18d, 18e composing the second conductor pattern facing thereto. Therefore, it is possible to further downsize the electromagnetic coupler.

The embodiments of the present invention were explained in conjunction with appended drawings. It would be obvious for one ordinary skill in the art that various alterations and modification can be made without going beyond the scope and technical idea of the present invention.

For example, in the above embodiments, the first conductor pattern and the second conductor pattern are formed in one face of the double-layered printed board, and the feeding pattern and the ground are formed in another face thereof. However, the present invention is not limited thereto. A printed board having layers of three or more may be used, and any two of the plural layers in the printed board may be used. Further, in the above embodiments, the electromagnetic coupler using the double-layered printed board is shown. However, an electromagnetic coupler may be formed with using a conductor plate comprising a conductor such as copper or iron. Still further, in the above embodiments, the capacitor is realized by using the gap between the first conductor pattern and the second conductor pattern. However, it is also possible to provide a further capacitor (e.g. chip capacitor) between the first conductor pattern and the second conductor pattern. All the alternation and modifications as described above should be included in the technical idea and the scope of the present invention.

Although the invention has been described with respect to the specific embodiments for complete and clear disclosure, the appended claims are not to be therefore limited but are to be construed as embodying all modifications and alternative constructions that may occur to one skilled in the art which fairly fall within the basic teaching herein set forth.

What is claimed is:

1. An electromagnetic coupler, comprising:
a first conductor pattern, formed as a single contiguous area of conductive material, and a second conductor pattern separated from the first conductor pattern, the first conductor pattern and the second conductor pattern being formed in a first plane;
a feeding pattern comprising a conductor, for connecting to a feeding system;
a ground comprising a conductor and being separated from the feeding pattern, the feeding pattern and the ground being formed in a second plane; and
linear conductors electrically connected between the first conductor pattern and the feeding pattern, and between the second conductor pattern and the ground, respectively,
wherein the ground covers a surface of the second plane except for the feeding pattern and a capacitive gap separating the feeding pattern and the ground.

2. The electromagnetic coupler according to claim 1, wherein the linear conductors are vertical to the second plane.

3. The electromagnetic coupler according to claim 1, wherein a printed board is formed between the first plane and the second plane, and the linear conductors are formed inside of through-holes formed in the printed board.

4. The electromagnetic coupler according to claim 1, wherein the second conductor pattern is point-symmetrical with respect to a connecting point between the first conductor pattern and one of the linear conductors.

5. The electromagnetic coupler according to claim 1, wherein the linear conductors are point-symmetrical with respect to a connecting point between the first conductor pattern and one of the linear conductors.

6. The electromagnetic coupler according to claim 1, wherein the second conductor pattern comprises a plurality of conductor patterns, each formed as a contiguous area of conductive material, and each of the plurality of conductor patterns forming the second conductor pattern is connected to the ground via respective linear conductors.

7. The electromagnetic coupler according to claim 6, wherein each of the first conductor pattern and the second conductor pattern has a rectangular shape.

8. The electromagnetic coupler according to claim 7, wherein the second conductor pattern comprises four rectangular conductor patterns, and the four rectangular conductor patterns are radially disposed to face sides of an outer periphery of the first conductor pattern, respectively.

9. The electromagnetic coupler according to claim 8, wherein a total number of the linear conductors formed between the second conductor pattern and the ground is four, and the four linear conductors are disposed with an interval of an angle of 90° with respect to a center connecting point between the first conductor pattern and one of the four linear conductors as a center.

10. The electromagnetic coupler according to claim 6, wherein the first conductor pattern has a rectangular shape, and the second conductor pattern comprises two L-shaped conductor patterns surrounding the first conductor pattern.

11. The electromagnetic coupler according to claim 6, wherein the first conductor pattern has a cross-like shape, and the second conductor pattern comprises four conductor patterns, each of which has a side facing at least one side of an outer periphery of the first conductor pattern.

12. The electromagnetic coupler according to claim 1, wherein the second conductor pattern surrounds the first conductor pattern.

13. The electromagnetic coupler according to claim 12, wherein the first conductor pattern has a circular shape and the second conductor pattern has an annular shape.

14. The electromagnetic coupler according to claim 12, wherein the first conductor pattern has a rectangular shape and the second conductor pattern has a rectangular shape having an inner periphery facing an outer periphery of the first conductor pattern.

15. An electromagnetic coupler, comprising:
a first conductor pattern and a second conductor pattern separated from the first conductor pattern, the first conductor pattern and the second conductor pattern being formed in a first plane;
a feeding pattern comprising a conductor, for connecting to a feeding system;
a ground comprising a conductor and being separated from the feeding pattern, the feeding pattern and the ground being formed in a second plane; and
linear conductors electrically connected between the first conductor pattern and the feeding pattern, and between the second conductor pattern and the ground, respectively,
wherein the first conductor pattern has a star-like shape having a plurality of protrusions and the second conductor pattern has a star-like shape having an inner periphery facing an outer periphery of the first conductor pattern.

16. The electromagnetic coupler according to claim 12, wherein the linear conductors are formed between the second conductor pattern and the ground.

17. The electromagnetic coupler according to claim 16, wherein the linear conductors are equiangular with respect to a center connecting point between the first conductor pattern and one of the linear conductors.

18. The electromagnetic coupler according to claim 12, wherein the second conductor pattern is divided into plural sections in a circumferential direction.

19. The electromagnetic coupler according to claim 1, wherein the ground surrounds the feeding pattern.

20. A communication apparatus, comprising:
an electromagnetic coupler comprising:
a first conductor pattern and a second conductor pattern separated from the first conductor pattern, the first conductor pattern and the second conductor pattern being formed, respectively, as a first contiguous area of conductive material and a second area of contiguous conductive material, in a first plane;
a feeding pattern comprising a conductor for connecting to a feeding system;
a ground comprising a conductor and being separated from the feeding pattern, the feeding pattern and the ground being formed, respectively, as a third contiguous area of conductive material and a fourth contiguous area of conductive material, in a second plane; and linear conductors electrically connected between the first conductor pattern and the feeding pattern, and between the second conductor pattern and the ground, respectively, wherein the ground covers a surface of the second plane except for the feeding pattern and a capacitive gap separating the feeding pattern and the ground, and wherein data is transmitted by using an electrostatic field or an induced electric field.

* * * * *